United States Patent

Nakamura et al.

Patent Number: 6,057,629
Date of Patent: May 2, 2000

[54] PIEZOELECTRIC VIBRATOR FOR SUPPRESSING HARMONIC VIBRATIONS OF LOWER ORDERS

[75] Inventors: Kiyoshi Nakamura, Sendai; Koichi Hirama, Kouza-gun, both of Japan

[73] Assignees: Kiyoshi Nakamura, Miyagi; Toyo Communications Equipment Co., Ltd., Kanagawa, both of Japan

[21] Appl. No.: 09/157,638

[22] Filed: Sep. 21, 1998

[30] Foreign Application Priority Data

Sep. 24, 1997 [JP] Japan ................ 9-276418
Oct. 23, 1997 [JP] Japan ................ 9-309413

[51] Int. Cl.⁷ ............. H03H 9/15; H01L 41/047
[52] U.S. Cl. ............ 310/312; 310/320; 310/326; 310/366
[58] Field of Search ................. 310/320, 312, 310/326, 366

[56] References Cited

U.S. PATENT DOCUMENTS

| | | | |
|---|---|---|---|
| 1,781,680 | 11/1930 | Cady | 310/312 |
| 3,527,967 | 9/1970 | Dyer et al. | 310/366 |
| 3,571,632 | 3/1971 | De Jong | 310/312 |
| 4,979,176 | 12/1990 | Young et al. | 372/13 |
| 5,773,912 | 6/1998 | Saeki et al. | 310/326 |
| 5,828,159 | 10/1998 | Miyagawa et al. | 310/340 |

*Primary Examiner*—Thomas M. Dougherty
*Attorney, Agent, or Firm*—Koda & Androlia

[57] ABSTRACT

A unit for suppressing harmonic vibration of a lower order which does not have desired frequency in an overtone resonator consisting main electrodes and sub electrodes. Harmonic vibration of a lower order suppressing piezoelectric vibrator comprises main electrodes arranged on a piezoelectric substrate and sub electrodes arranged in the vicinity of the main electrodes with gaps provided therebetween. If the electric equivalent circuit of the resonator is expressed by a coupling circuit which connects in series a circuit, which connects in parallel a series resonance circuit by the sub electrodes and coupling capacity indicating that the main electrodes are coupled with the sub electrodes, to a series resonance circuit by the main electrodes, then their loop frequencies substantially coincide with each other.

5 Claims, 11 Drawing Sheets

PIEZOELECTRIC VIBRATOR FOR SUPPRESSING HARMONIC VIBRATIONS OF LOWER ORDERS

BACKGROUND OF THE INVENTION

1. Field of the Invention

The present invention relates to a quartz resonator which suppresses harmonic vibration of a lower order (or overtone vibration). The present invention relates to, in particular, a harmonic vibration of a lower order suppressing quartz resonator wherein a value obtained by adding 1 to a ratio of value Q ($Q_1$) of a main-electrode section to value Q ($Q_2$) of a sub-electrode section is defined as suppression degree, the gap between a main-electrode and a sub-electrode is determined using the suppression degree and harmonic vibration of a lower order is thereby lowered to below the oscillation limit of an oscillation circuit.

2. Background of the Invention

Conventionally, a quartz resonator has been widely used from communications equipment to industrial equipment to household equipment. This is because the quartz resonator has characteristics of, for example, small size, high frequency stability and accuracy. In recent years, harmonic (or overtone) quartz resonator has been used more frequently since operation frequency becomes higher in mobile communications, and the clock frequency of computers becomes higher.

To obtain desired high frequency vibration using a harmonic quartz resonator, it is necessary to give special consideration such as providing coils to the circuits so as not to cause harmonic (including a fundamental wave) vibration of a lower order than desired order of harmonic vibration to generate oscillation and setting a circuit constant to a special value.

For purposes of improving such inconvenience mentioned above, there have been proposed several types of harmonic quartz resonators which suppress the resonance response of harmonic vibration of a lower order. One of the inventors of the present invention has indicated, as disclosed in Japanese Patent Application Publication No. 4-76527, providing sub electrodes on both sides of the vicinity of a main electrode with gaps between them, determining the gap appropriately to thereby sufficiently contain the vibration energy of the desired harmonic vibration within the main electrode, and propagating the vibration energy of harmonic vibration of a lower order through the gap to the sub electrode side as a traveling wave to thereby suppress the resonance response of the harmonic vibration of a lower order.

In the vibrator which suppresses a harmonic vibration of a lower order as stated above, however, if sub electrodes arranged on both sides of the vicinity of the main electrode are small to make the quartz resonator smaller in size, the harmonic (including fundamental wave) vibration of a lower order is insufficiently suppressed. In order to sufficiently suppress the vibration of a lower order at the desired frequency, a prototype of the vibrator has to be repeatedly made and many steps and high costs are required to obtain necessary data for the suppression of the harmonic vibration of a lower order.

SUMMARY OF THE INVENTION

The present invention has been made to overcome the above-stated disadvantages. It is the object of the present invention to provide a quartz resonator which can easily suppress a harmonic vibration of a lower order.

To attain the above object, the invention of a surface acoustic wave device according to the present invention as recited in claim 1 is a harmonic vibration of a lower order suppressing piezoelectric vibrator characterized by comprising:

a pair of main electrodes, facing each other and arranged on upper and lower surfaces at an almost center of a piezoelectric substrate;

pairs of sub electrodes, facing each other and arranged on both sides of the vicinity of the main electrodes with gaps provided therebetween, respectively; and a vibration energy damper coated to deteriorate vibration strength by the sub electrodes, wherein when an electric equivalent circuit of the vibrator is expressed by a coupling circuit, which connects a circuit which connects in parallel a series resonance circuit ($L_2$, $C_2$, $R_2$) by the sub electrodes and the dampers to coupling capacity ($C_k$) indicating the main electrodes and the sub electrodes, to a series resonance circuit ($L_1$, $C_1$, $R_1$) by the main electrodes, loop frequency consisting of the series resonance circuit by the main electrodes and the coupling capacity substantially coincides with loop frequency consisting of the series resonance circuit by the sub electrodes and the coupling capacity.

The invention as recited in claim 2 is a harmonic vibration of a lower order suppressing piezoelectric vibrator characterized in that if value Q of a main-electrode section in a to-be-suppressed low harmonic is defined as $Q_1$, value Q of a sub-electrode section including a damper is defined as $Q_2$ and suppression degree $R_h$ is defined as $R_h=1+Q_1/Q_2$ in the equivalent circuit, and coupling capacity $C_k$ is expressed as $$R_h = 1 + \frac{Q_1}{Q_2} \tag{24}$$

then a gap between a main-electrode and a sub-electrode is determined from dimensions of the main-electrode and the sub-electrode, frequency decrease of the main-electrode and frequency decrease of the sub-electrode, based on the coupling capacity $C_k$.

The invention as recited in claim 3 is a harmonic vibration of a lower order suppressing piezoelectric vibrator according to one of claims 1 and 2, characterized in that a difference between the loop frequency of the main-electrode section and the loop frequency of the sub-electrode section falls within a range of $\pm 4 \times 10^{-4}$.

The invention as recited in claim 4 is a harmonic vibration of a lower order suppressing piezoelectric vibrator according to claims 1 and 2, characterized in that the equivalent resistance of harmonic vibration of a lower order is suppressed and the suppression degree $R_h$ is set at the cube of the order n of desired harmonic or more so as to selectively oscillate the desired harmonic. This is because negative resistance, at a time the piezoelectric oscillator is turned on, is proportional to the inverse of the square of the oscillation frequency and the equivalent resistance of the vibrator is proportional to the order n of harmonic.

DESCRIPTION OF THE EMBODIMENT OF THE INVENTION

Detailed description will now be given to the embodiment of the present invention with reference to the accompanying drawings.

Figure 1A:
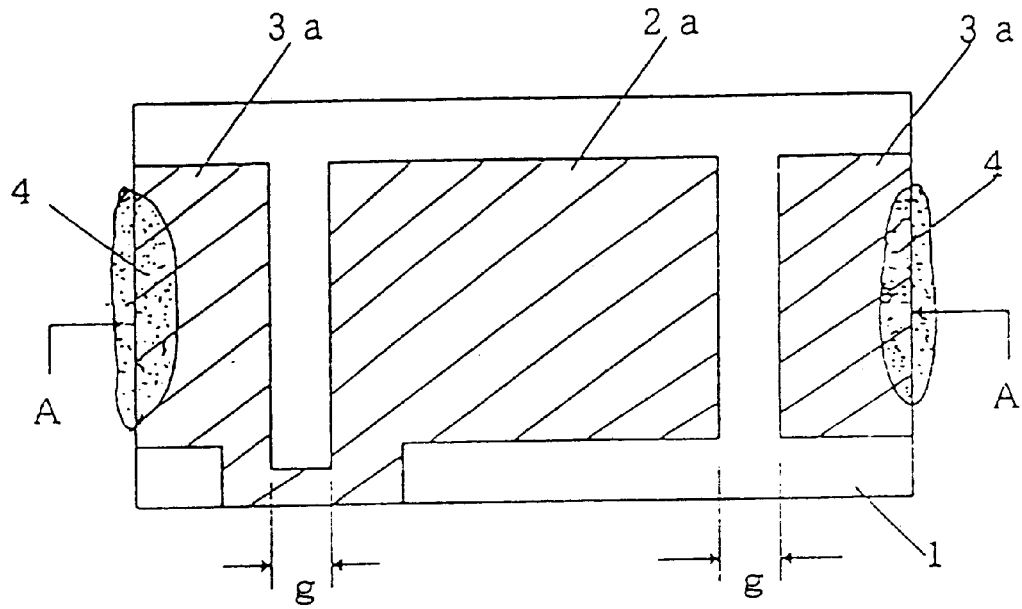
FIGS. 1(a) and 1(b) are cross sectional views showing an example of a vibrator for suppressing harmonic vibration of a lower order.
Figure 1B:
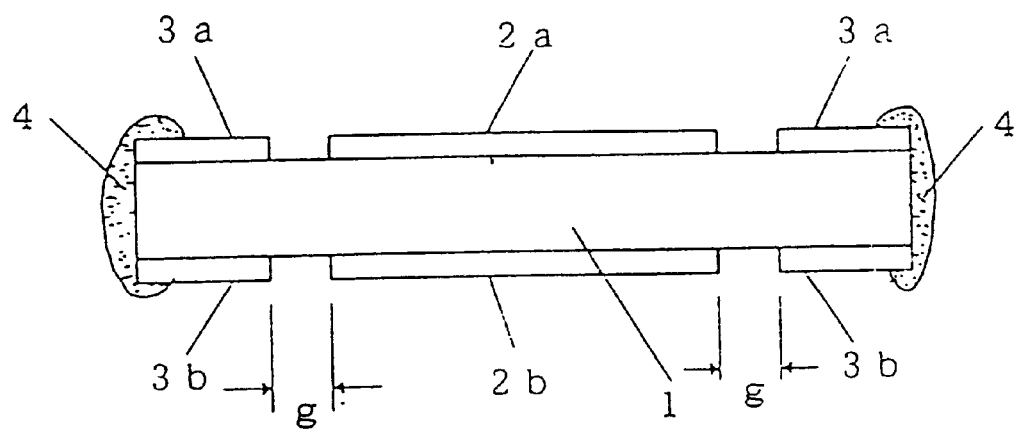

The cross sectional view of an example of the structure of a quartz resonator which suppresses harmonic vibration of a lower order is shown in FIGS. 1(a) and 1(b). As shown therein, a pair of main electrodes 2a and 2b which face each other are provided at the substantially center on the upper and lower surfaces of a piezoelectric substrate 1, respectively, Gaps g are provided on both sides of the vicinity of the main electrodes 2a and 2b, respectively. Pairs of sub electrodes 3a and 3b which face each other are provided on both sides of the vicinity of the main electrodes 2a and 2b, respectively. In addition, a substance 4 which mechanically absorbs vibration energy, such as a conductive adhesive coating, is applied onto the sub electrodes 3a and 3b.

Figure 2A:
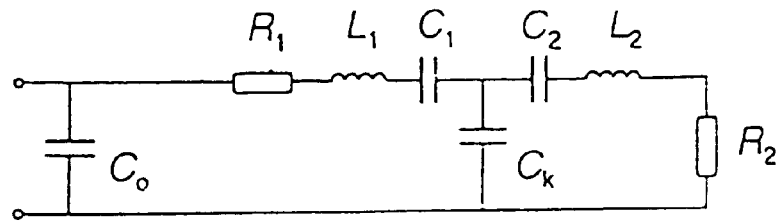
FIGS. 2(a), 2(b) and 2(c) are a lumped constant equivalent circuit of the vibrator for suppressing harmonic vibration of a lower order.

As is generally known by the person in the art, FIG. 2(a) shows a lumped constant equivalent circuit of the right or left side of the quartz resonator shown in FIG. 1, if seen from the main electrodes 2a and 2b. In the equivalent circuit, reference numerals $L_1$, $C_1$ and $R_1$ denote mechanical resonance of the main electrodes 2a and 2b, reference numerals $L_2$, $C_2$ and $R_2$ denote mechanical resonance of the sub electrodes 3a and 3b. Capacity $C_0$ is the parallel capacitance between the main electrodes 2a and 2b and capacity $C_k$ denotes acoustic coupling between the main electrodes 2a, 2b and the sub electrodes 3a, 3b. Resistor $R_2$ is mechanical resistance mainly consisting of a vibration energy damper 4. FIG. 2(a) is an ordinary form for analysis. If resistance at terminals a–a' of FIG. 2(b) at the frequency of the harmonic vibration of a lower order to be suppressed is maximized, the harmonic vibration of a lower order can be suppressed to a maximum. For purposes of making process simple, resistance at terminals b–b' is obtained, which does maintain, however, normal characteristics.

Figure 2B:
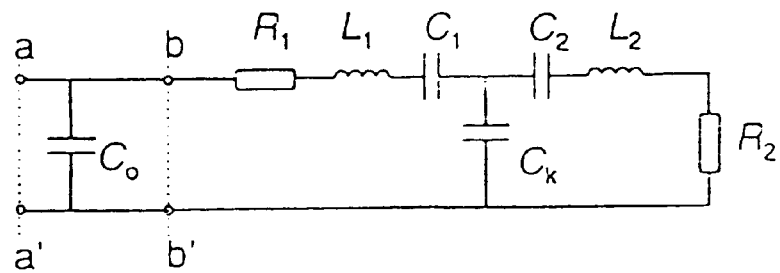
Figure 2C:
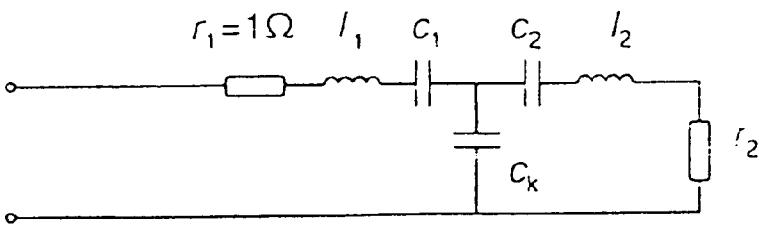

When the input impedance $Z_{in}$ of the equivalent circuit of FIG. 2(b) is obtained, the degree of freedom of element values amounts to seven (i.e. $R_1$, $L_1$, $C_1$, $C_2$, $L_2$, $R_2$, $C_k$). If all of the constants are normalized with the primary resistance $R_1$ of FIG. 2(b), the degree of freedom is six (i.e. $l_1$, $c_1$, $c_2$, $l_2$, $r_2$, $c_k$) as shown in FIG. 2(c). The impedance $Z_{si}$ (i=1, 2) of the series arms of primary side (l1, c1, r1) and secondary side ($l_2$, $c_2$, $r_2$) can be approximated by the following Equations in the vicinity of the resonant point of the to-be-suppressed harmonic vibration of a lower order:

$$z_{si} = r_i(1 + j2Q_i\delta_i) \quad (1)$$

wherein $$Q_i = \frac{\omega_{si} l_i}{r_i} \quad (2)$$

$$\delta_i = \frac{\omega - \omega_{si}}{\omega_{si}} \quad (3)$$

The secondary impedance $Z_2$ including the coupling capacity $c_k$ is expressed by the following Equations in the vicinity of the resonant point of the to-be-suppressed harmonic vibration of a lower order:

$$z_2 = r_2 \frac{Q_2}{\gamma_2} \frac{Q_2}{\gamma_2} - \frac{j\left(4Q_2^2\delta_2^2 - 2\frac{Q_2}{\gamma_2}Q_2\delta_2 + 1\right)}{1 + 4\left(Q_2\delta_2 - \frac{1}{2}\frac{Q_2}{\gamma_2}\right)^2}, \quad (4)$$

wherein $$\gamma_i = \frac{c_k}{c_i} \quad (5)$$

The overall impedance $Z_{in}$ of FIG. 2(c) is expressed by the following Equation:

$$z_{in} = 1 + j2Q_1\delta_1 + r_2 \frac{Q_2}{\gamma_2} \frac{\frac{Q_2}{\gamma_2} - j\left(4Q_2^2\delta_2^2 - 2\frac{Q_2}{\gamma_2}Q_2\delta_2 + 1\right)}{1 + 4\left(Q_2\delta_2 - \frac{1}{2}\frac{Q_2}{\gamma_2}\right)^2} \quad (6)$$

In FIG. 2(c), if the two frequencies of primary side and secondary side coincide with each other through acoustic coupling, energy flows between the primary side and secondary side most efficiently and the harmonic vibration of a lower order can be most suppressed.

Now, the degree of the increase in the resonance frequency of the series arm by the coupling capacity $c_k$ will be obtained. To maximize $Z_{in}$ if FIG. 2(c), it is necessary that the two loop frequencies $\omega_{a1}$ and $\omega_{a2}$, coupled by the coupling capacity $c_k$ of the circuit shown in FIG. 3, coincide with each other and that energy flows from the primary side to the secondary side.

The two loop frequencies $\omega_{ai}$ (i=1, 2) are obtained by the following Equation if a loss is ignored:

$$\omega_{ai}^2 = \frac{1}{l_i \frac{c_i c_k}{c_i + c_k}} \quad (7)$$

Therefore, the increase $\delta_{ai}$ of the loop frequencies based on the resonance frequencies of the series arms is approximated by the following Equation:

$$\delta_{ai} = \frac{\omega_{ai} - \omega_{si}}{\omega_{si}} \cong \frac{1}{2}\frac{1}{\gamma_i} \quad (8)$$

Here, a value defined by the following Equation is used as a variable for measuring frequency:

$$Q_i \delta_{ai} = \frac{1}{2}\frac{Q_i}{\gamma_i} \quad (9)$$

This value is obtained by multiplying the frequency of Equation 8 by value Q of each series arm. Although the frequency of Equation 8 and the value Q of the series arm are originally dimensionless, they are useful since the measurement scale is a unit quantity, i.e., a value proximate to 1.

As shown in Equation 9, the loop frequency of each of the arms increases as it is understood by Equation 9 and the following Equations are introduced to make the series resonance frequency serve as a basis:

$$d_1 = Q_1 \delta_1 - \frac{1}{2}\frac{Q_1}{\gamma_1} \quad (10)$$

$$d_2 = Q_2 \delta_2 - \frac{1}{2}\frac{Q_2}{\gamma_2} \quad (11)$$

Next, to make the two frequencies coincident with each other and to express both Equations 10 and 11 on the same scale $\delta_2$, Equation 10 is expressed with $Q_2$ and $\gamma_2$. In addition, to make the primary and secondary frequencies of FIG. 3 coincident with each other, $\delta$, and $\delta_2$ are defined as $\delta_1 = \delta_2$. The following Equation is then obtained:

$$d_1 = \frac{Q_1}{Q_2}Q_2\delta_1 - \frac{1}{2}\frac{Q_1}{Q_2}\frac{\gamma_2}{\gamma_2}\frac{Q_2}{\gamma_2} \quad (12)$$

If Equations 11 and 12 are substituted for Equation 6 and the secondary loop frequency (anti-resonance frequency) $\delta_{a2}$ is used as a basis for frequency, then the overall impedance of the equivalent circuit is expressed as follows:

$$z_{in} = 1 + \frac{k_r\left(\frac{Q_2}{\gamma_2}\right)^2}{1+4(Q_2\delta_2)^2} + j2k_r\left\{\frac{1}{k_1} - \frac{\left(\frac{Q_2}{\gamma^2}\right)^2}{1+4(Q_2\delta_2)^2}\right\}Q_2\delta_2, \quad (13)$$

wherein $$k_r = \frac{r_2}{r_1} \quad (14)$$

$$k_l = \frac{l_2}{l_1} \quad (15)$$

Figure 3:
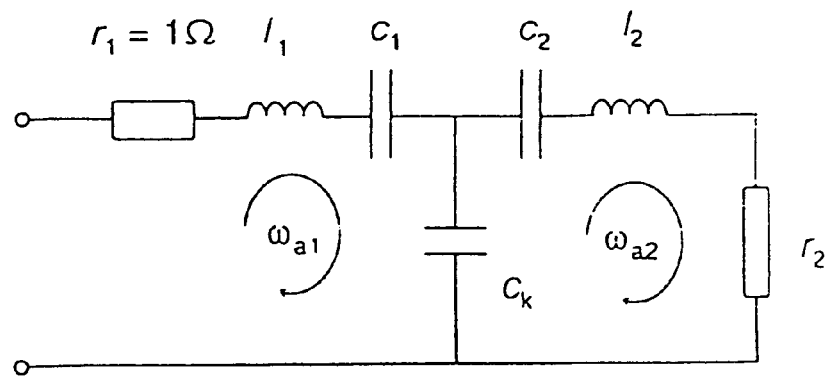
FIG. 3 is a view showing two loop frequencies of the lumped constant equivalent circuit of the vibrator for suppressing harmonic vibration of a lower order.

Equation 13 is one indicating impedance characteristics at the input terminal if the primary side and the secondary side are being coupled in the equivalent circuit of FIG. 3.

Figure 4A:
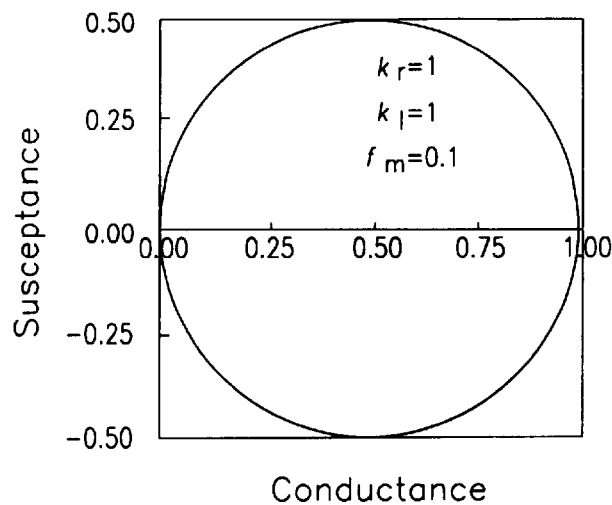
FIGS. 4(a), 4(b) and 4(c) are admittance circle diagrams seen from the input terminal of the vibrator for suppressing harmonic vibration of a lower order, with $f_m$=0.1, 1 and 10, respectively.
Figure 4B:
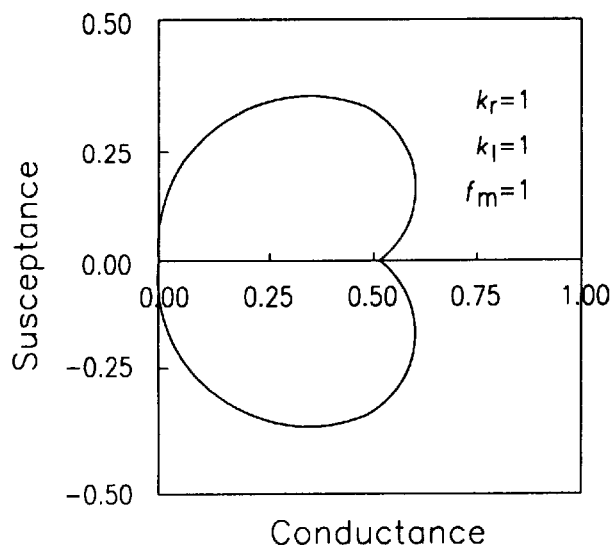
Figure 4C:
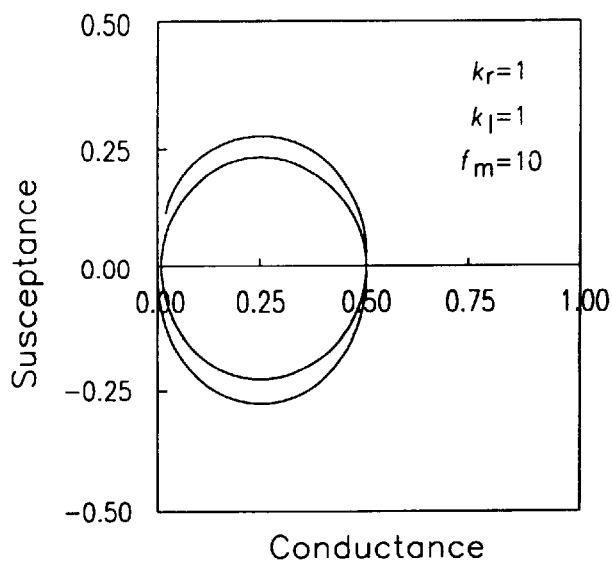

First, a case of coupling the resonance arm of the main electrodes 2a and 2b and that of the sub electrodes 3a and 3b will be examined. If an admittance circle diagram is numerically calculated with parameter $f_m = Q_2/\gamma_2$ as 0.1, 1, 10, respectively in Equation 13, the results are illustrated by FIGS. 4(a), 4(b) and 4(c). Other parameters (resistance ratio $k_r$ and inductance ratio $k_l$) are selected as 1.

FIG. 4(a) is a case where coupling capacity $c_k$ is large. In that case, the coupling capacity $c_k$ in the equivalent circuit of FIG. 2(c) is large and the coupling capacity $c_k$ is regarded as it is short-circuited. Therefore, this is similar to the case of resonance characteristics shown by only the primary side circuit.

FIG. 4(b) is a case where the coupling capacity $c_k$ in the equivalent circuit of FIG. 2(c) is a certain value and shows a circle diagram of heart shape. FIG. 4(b) is characterized in that the coordinate (0.5, 0) is a depression point on the circle diagram.

FIG. 4(c) is a case where the coupling capacity $c_k$ is small. In that case, since the portion of the coupling capacity $c_k$ in the equivalent circuit of FIG. 2(c) is regarded as it is opened. Therefore, the case of FIG. 4(c) has characteristics similar to the resonance characteristics exhibited only by the primary and secondary series circuits. The diameter of the admittance circle is close to the diameter determined by the sum of the resistance values of the primary side and the secondary side. As can be seen from FIG. 4, the admittance circle diagram in a coupling state is greatly changed with the value $f_m$.

As a result of the computation with Equation 13, it was realized that a heart-shaped characteristics of the admittance circle is obtained by setting the coupling capacity $c_k$ at a certain value in the equivalent circuit of FIG. 2(c). The coupling capacity $c_k$ with the heart-shaped circle diagram is one in neither a short-circuit state nor an open-circuit state but is an intermediate value therebetween. The circle diagram with this heart shape serves as a guidepost for the suppression of the harmonic vibration of a lower order. Therefore, conditions for the parameters in the circuit of FIG. 2(c) in which such a heart-shaped circle appears will be examined.

At a point where this heart-shaped circle is depressed, the gradient of the locus of the admittance circle toward the axis of abscissa is zero. Accordingly, the conditions for the zero susceptance are obtained.

The following Equations are obtained while a real part is defined as R and an imaginary part is defined as X according to Equation 13:

$$R = 1 + k_r \frac{fm^2}{1+t^2} \quad (16)$$

$$X = 2k_r \left(\frac{1}{k_1} - \frac{fm^2}{1+t^2}\right) t, \quad (17)$$

wherein $$t = Q_2 \delta_2 \quad (18)$$

$$fm = \frac{Q_2}{\gamma_2} \quad (19)$$

The admittance circle diagram of FIG. 4 graphs a locus while the inverse G of the resistance R is the axis of abscissa, the inverse B of the reactance X is the axis of ordinate and t is used as a frequency parameter. If the circle diagram exhibits a heart shape, the differential coefficient of the circle diagram is zero at the depression point. Since it is true for the impedance circle diagram instead of the admittance circle diagram, the following Equation may be used to obtain conditions for a heart-shaped circle diagram:

$$\frac{dX}{dR} = 0 \quad (20)$$

To obtain Equation 20, since Equations 16 and 17 are continuously differentiable with respect to t as expressed by Equation 18, the following Equation may be obtained.

$$\frac{dX}{dt} = 0 \quad (21)$$

Equation 17 is substituted for Equation 21, and in consideration that a heart-shaped state of the circle diagram causes at the anti-resonance frequency of the secondary series circuit, Equation 22 is obtained $$fm = \frac{1}{\sqrt{k_1}} \quad (22)$$

Thus, conditions for providing a heart-shaped circle diagram are obtained.

Next, in this state, a resistance value $R_h$ at the depression point of the harmonic vibration of a lower order to be suppressed will be calculated. By substituting Equation 22 for Equation 16, the following Equation is obtained:

$$R_h = 1 + \frac{k_r}{k_1} \quad (23)$$

Equation 23 can be rewritten into the following Equation:

$$R_h = 1 + \frac{Q_1}{Q_2} \quad (24)$$

Equations 23 and 24 indicate suppression degree $R_h$, i.e., the degree of suppression of the to-be-suppressed harmonic vibration of a lower order. As is obvious from Equation 23, the suppression degree $R_h$ is obtained by subtracting the ratio of the equivalent resistance r2 at the sub electrodes 3a and 3b to the equivalent resistance r1 at the main electrodes 2a and 2b by the ratio of the equivalent inductance 12 of the sub electrodes 3a and 3b to the equivalent inductance 11 of the main electrodes 2a and 2b and adding 1 to the resultant value. As is obvious from Equation 24, the suppression degree $R_h$ is also expressed as one by adding 1 to the ratio of value Q ($Q_1$) of the main electrodes 2a and 2b to the value Q ($Q_2$) of the sub electrodes 3a and 3b.

It should be noted, in particular, that optimum conditions for suppressing the harmonic vibration of a lower order are a large value Q ($Q_1$) of the main electrodes 2a and 2b and a small value Q ($Q_2$) of the sub electrodes 3a and 3b in the to-be-suppressed harmonic vibration of a lower order. Using Equations 15, 19, 22 and 23, the coupling capacity $c_k$ is expressed by the following:

$$c_k = \frac{Q_1}{R_h - 1} \times c_2 \sqrt{\frac{l_2}{l_1}} \quad (25)$$

This Equation allows the suppression degree $R_h$ to be coupled with the coupling capacity $C_k$. That is to say, the coupling coefficient k of the equivalent circuit shown in FIG. 2 is, as well known, expressed as $k^2 = c_1 c_2 / c_k^2$. In addition, if using a well-known monolithic filter designing technique based on electrode dimension of the main electrodes 2a and 2b, and the sub electrodes 3a and 3b, the gaps between the electrodes, and amount of the frequency decrease, the coupling coefficient k is expressed, based on two resonance frequencies fs and fa resulting from coupling, as $k^2 = (fa-fs)^2/(fs \cdot fa)$, and the gap g between the both electrodes can be obtained by using the coupling capacity $c_k$.

By way of example, if the suppression degree $R_h$ is 101 and value Q of the main electrodes 2a and 2b is 50,000, then value Q of the sub electrodes 3a and 3b is obtained from Equation 24 as Q2=500. The condition for providing a heart-shaped circle diagram is expressed in Equation 22. On the right side of Equation 22, $k_l$ is the ratio of the inductance $l_2$ of the sub electrodes 3a and 3b to the inductance $l_1$ of the main electrodes 2a and 2b, i.e, $k_1 = l_2/l_1$, therefore, $\gamma_2$ is obtained from $Q_2/\gamma_2 = f_m$ using Equation 22. $C_k$ is obtained from $\gamma_2 = c_k/c_2$. The gap between the main electrodes 2a, 2b and the sub electrodes 3a, 3b is obtained from the well-known monolithic filter designing technique after the coupling capacity $c_k$ is obtained.

Figure 5A:
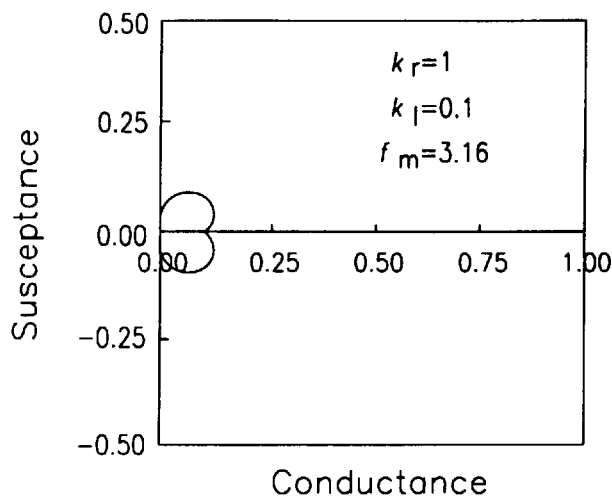
FIG. 5(a) is an admittance circle diagram of the vibrator for suppressing harmonic vibration of a lower order in case the suppression degree is 10.

Furthermore, it will be examined how suppression degree is obtained in portions other than the secondary side anti-resonanc e frequency. FIG. 5(a) shows an admittance circle diagram in case of $k_l = 0.1$ and $k_r =$.

Figure 5B:
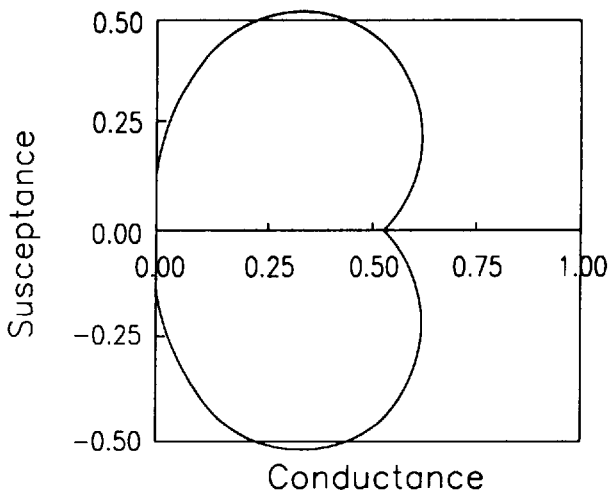
FIG. 5(b) is a view obtained by elongating the axis of abscissas and the axis of ordinates of FIG. 5(a) with a depression point coincident with point (0.5, 0.0)

If the relationship between fm and inductance $k_1$ satisfies Equation 22, then a depression point is provided, the admittance circle diagram becomes smaller in size and suppressed. FIG. 5(b) is a view obtained by lengthening the axis of abscissas and the axis of ordinates of this admittance circle diagram by the value of Equation 23 and normalizing the depression point to the same ordinate (0.5, 0.0) on the axis of abscissa of FIG. 4(b). FIG. 5(b) shows a case where suppression degree is set at 11 as a parameter. The shape after suppression at points other than the depression point is similar to that shown in FIG. 4(b). If normalized at the depression point, admittance increase or deterioration in the suppression degree are little compared with FIG. 4(b). Normally, the suppression degree deteriorates to twice as large as the original at the highest. If the suppression degree is set in view of the possibility of deterioration, it is possible to use Equations 23 and 24.

Figure 6:
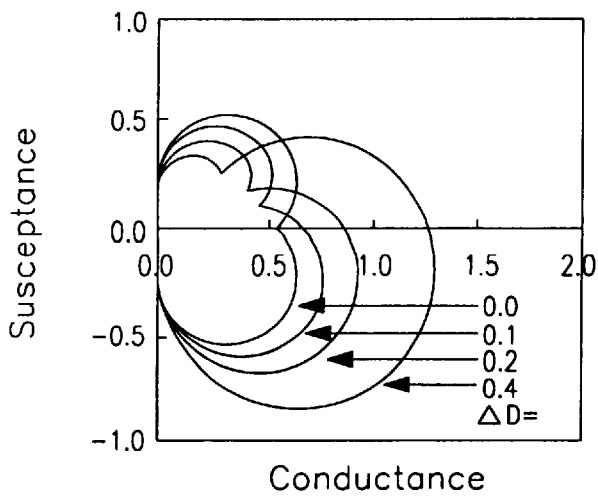
FIG. 6 shows suppression characteristics if the resonance loop of the main-electrode differs in frequency from that of the sub-electrode.

FIG. 6 shows a simulation of the admittance circle diagram seen from the input terminal in a case where the primary resonance frequency $\omega_{a1}$ and the secondary resonance frequency $\omega_{a2}$ in FIG. 3 are slightly shifted. Assuming that a quartz resonator is smaller in size, areas of the sub electrodes 3a and 3b are halved and the inductance ratio $k_1$ of the main electrodes 2a, 2b to the sub electrodes 3a, 3b is set at 2. As for the remaining parameters, relative resistance $k_r$ is set at 100, $f_m$ is at 0.7 and shifting amounts of frequency (expressed by Equation 26) are set at 0.4, 0.2 and 0.1. A case where there is no frequency shift, that is, a shifting amount is 0.0, is also shown in FIG. 6.

Based on FIG. 6, if a deterioration up to twice as large as the optimum suppression point (½ in resistance) is allowed, a frequency shift is:

$$\Delta D = \delta_{a1}Q_1 - \delta_{a2}Q_2 < \pm 0.2 \quad (26)$$

Therefore, if $Q_2$ is about 500 (Q2=500), the deterioration is kept within twice as large as the optimum suppression by satisfying the following Equation:

$$\Delta D/Q_2 = \Delta \delta_{a2} < \pm 0.4 \times 10^{-4} \quad (27)$$

By so doing, it was discovered that the suppression degree $R_h$ is set at 101.

Next, it will be examined whether the above suppression degree $R_h$ can be realized without adjusting the thickness of the sub electrodes 3a, 3b and the like. It is possible to set value $Q_1$ of the main electrodes 2a, 2b at 50,000 or more and value $Q_2$ of the sub electrodes 3a, 3b at 500 or less with normal technique in the to-be-suppressed harmonic vibration of a lower order. The coefficient of the coupling between the main electrodes 2a, 2b and the sub electrodes 3a, 3b (which relates to the gap between the both electrodes if an amount of a frequency decrease and the like are determined) at the optimum suppression may be realized by using the well-known monolithic filter designing technique.

Since adjusted to a desired harmonic frequency, the resonance frequency of the to-be-suppressed harmonic vibration of a lower order having vibration displacement exist on the main electrodes 2a and 2b is more accurate than the frequency accuracy of the sub electrodes 3a, 3b by a figure. Irregularity in the frequency of the sub electrodes 3a, 3b is normally within the range of Equation 27 even if irregularity in the substrate frequency and that in the thickness of the sub electrodes 3a, 3b are included therein. Therefore, it can be predicted that the above-stated suppression is realized without the need to adjust the thickness of the sub electrodes 3a, 3b and the like.

In an actual resonator, two pairs of sub electrodes 3a and 3b are provided on both sides of the main electrodes 2a and 2b, respectively, as shown in FIG. 1. Due to this, the suppression of the harmonic vibration of a lower order is twice as large as the above-stated simulation. However, if the adjustment displacement in the frequency of the sub electrodes 3a and 3b is as low as Equation 27, the deterioration of suppression is almost doubled and a desired value can be realized.

Next, consideration will be given to necessary suppression degree in case the vibrator of the present invention is applied to a Colpitts oscillator which dispenses with a coil. First, it is well known that suppression degree in a quartz resonator increases almost in proportion to the harmonic order of n as long as the dimensions of the substrate of the quartz resonator are not extremely small. The resistance components of the two-terminal input impedance in the Colpitts oscillator circuit without a coil monotonously decrease at certain positive resistance and reaches zero at the cut-off frequency as the frequency increases from a frequency lower than the cut-off frequency of the circuit. If the frequency further increases, the resistance components become negative. The negative value of resistance is a so-called negative resistance. As the frequency increases furthermore, the absolute value of the negative resistance increases. It reaches a maximum at a certain frequency. Thereafter, if the frequency increases, the absolute value of the negative resistance decreases in inverse proportion to the square of the frequency in a first approximation manner.

In case of using the harmonic vibration of a lower order suppressing piezoelectric vibrator according to the present invention as the above-stated vibrator, no vibration occurs in the low harmonic as a whole by setting depression degree at a cubic of the order n of desired harmonic or more even if it is the worst result for Equation 24. As for the actual oscillator circuit, negative resistance is lower than the above value. It is therefore enough to suppress vibration with the resistance of the harmonic vibration of a lower order of the harmonic vibration of a lower order suppressing piezoelectric vibrator according to the present invention, of about 2.5 power of the resistance value of desired harmonic vibration n.

Description has been given so far based on the analysis using a lumped constant. Next, it will be examined by distributed constant analysis whether or not the heart-shaped circle diagram which is a condition for setting a optimum parameter can be realized in the actual vibrator.

Normally, use of a distributed constant equivalent circuit makes it possible to well express the relationship between the dimension of the electrode in a loss-free one-dimensional model and reactance characteristics. Loss components are expressed while assuming a traveling wave propagated to the infinite-length transmission line as will be often seen.

Figure 7:
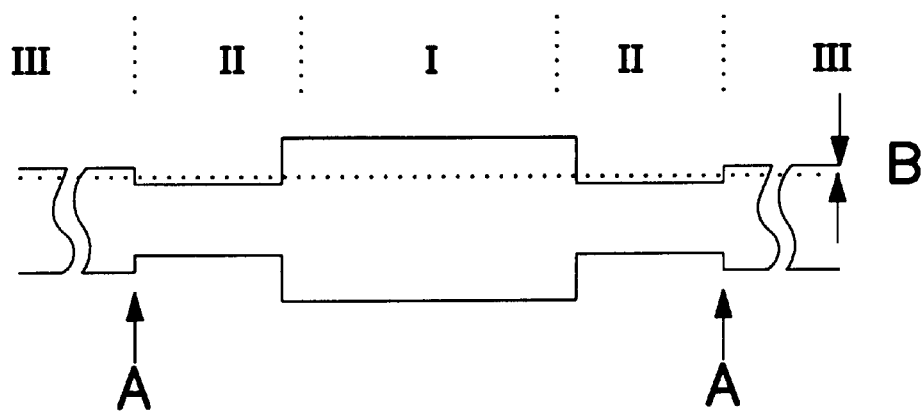
FIG. 7 shows an analysis model of a single electrode vibrator.

Prior to the analysis to the vibrator provided with sub electrodes, the admittance characteristics of a single-electrode vibrator will be obtained. A vibrator having a cross-sectional shape as shown in FIG. 7 is used as an analysis model.

Region I is a portion where main electrodes are arranged. Region II is a portion without electrodes. Region III is a portion where the traveling wave is propagated to a loss-free infinite-length transmission line to thereby generate loss. The dotted line in FIG. 7 shows an equivalent thickness into which the resonance frequency of the vibrator is converted. The region III is thicker than the equivalent thickness by B, thereby providing a propagation constant of real number to allow the traveling wave to exist therein.

The actual length of the piezoelectric substrate is length of end A to end A which is addition of the length a of the main-electrode to lengths b+b of two electrode-free portions, i.e., a+2b.

The mechanical term Zm of the input impedance seen from the main-electrode is expressed as follows:

$$R_e(Z_m) = Z_0 \frac{\frac{R''}{Z_0}}{\left\{\frac{\frac{R''}{Z_0}}{\left(\frac{R''}{Z_0}\right)^2 + \left(\frac{X''}{Z_0}\right)^2}\right\}^2 + \left\{\frac{\frac{X''}{Z_0}}{\left(\frac{R''}{Z_0}\right)^2 + \left(\frac{X''}{Z_0}\right)^2} - \frac{1}{2\gamma_0 a} + \frac{1}{\sin 2\gamma_0 a}\right\}^2} \quad (28)$$

$$I_m(Z_m) = Z_0 \frac{\frac{X''}{Z_0}}{\left(\frac{R''}{Z_0}\right)^2 + \left(\frac{X''}{Z_0}\right)^2} - \frac{1}{2\gamma_0 a} + \quad (29)$$

$$\frac{\frac{1}{\sin 2\gamma_0 a}}{\left\{\frac{\frac{R''}{Z_0}}{\left(\frac{R''}{Z_0}\right)^2 + \left(\frac{X''}{Z_0}\right)^2}\right\}^2 + \left\{\frac{\frac{X''}{Z_0}}{\left(\frac{R''}{Z_0}\right)^2 + \left(\frac{X''}{Z_0}\right)^2} - \frac{1}{2\gamma_0 a} + \frac{1}{\sin 2\gamma_0 a}\right\}^2} + 2\gamma_0 a Z_0;$$

or $$\frac{R''}{Z_0} = 2\frac{\frac{R}{Z_0}}{\left(1 - \tan 2\gamma_0 a \frac{X}{Z_0}\right)^2 + \left(\tan 2\gamma_0 a \frac{R}{Z_0}\right)^2} \quad (30)$$

$$\frac{X''}{Z_0} = 2\frac{\frac{X}{Z_0} - \tan 2\gamma_0 a \left\{\left(\frac{R}{Z_0}\right)^2 + \left(\frac{X}{Z_0}\right)^2\right\}}{\left(1 - \tan 2\gamma_0 a \frac{X}{Z_0}\right)^2 + \left(\tan 2\gamma_0 a \frac{R}{Z_0}\right)^2} \quad (31)$$

R+jX is impedance of the both ends of the region I and expressed as follows:

$$\frac{R}{Z_0} = \frac{Z_0'}{Z_0} \frac{\frac{Z_{01}}{Z_0'}(1 - \tanh^2 2\gamma_0' b)}{1 + \left(\frac{Z_{01}}{Z_0'}\tanh 2\gamma_0' b\right)^2} \quad (32)$$

$$\frac{X}{Z_0} = -\frac{Z_0'}{Z_0} \frac{\left\{1 + \left(\frac{Z_{01}}{Z_0'}\right)^2\right\}\tanh 2\gamma_0' b}{1 + \left(\frac{Z_{01}}{Z_0'}\tanh 2\gamma_0' b\right)^2} \quad (33)$$

$Z_0$, $Z_0'$ and $Z_{01}$ are characteristic impedance of the regions I, II and III, respectively. $g_0$, $g_0'$ and $g_{01}$ are propagation constants of the regions I, II and III, respectively.

If the impedance ratio $Z_{01}/Z_0''$ within Equations 32 and 33 is expressed by resonance frequency Y with the cut-off frequency of the region I normalized to 0 and the cut-off frequency of the region II normalized to 1, the following Equation is obtained:

$$\frac{Z_{01}}{Z_0'} = \sqrt{\frac{B}{1 - \Psi}} \quad (34)$$

Here, B denotes a normalized thickness difference and expresses as the dimension of the normalized frequency by subtracting the cut-off frequency of the region III in FIG. 7 from the resonance frequency of the entire vibrator. Due to this, if "normalized thickness difference B" is given, the actual resonance frequency changes. With this change, the thickness of the region III changes in a virtual manner.

Figure 8A:
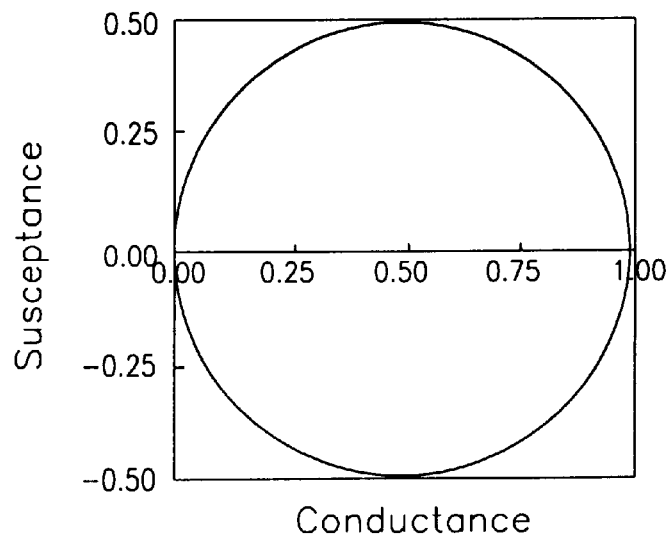
FIG. 8(a) is an admittance circle diagram of the single electrode vibrator of FIG. 7

An example of the admittance circle diagram of the resonator in FIG. 7 is illustrated by FIG. 8(a). The axis of abscissa indicates conductance G and the axis of ordinate indicates susceptance B. Each of the axes are expressed on an arbitrary unit. Dots in FIG. 8(a) denote that the normalized resonance frequency ψ is plotted in units of 1×10$^{-4}$ near the resonance point. FIG. 8(a) shows that even if the infinite-length transmission line is provided, the admittance circle diagram is complete round and it exhibits properties of the vibrator.

Figure 8B:
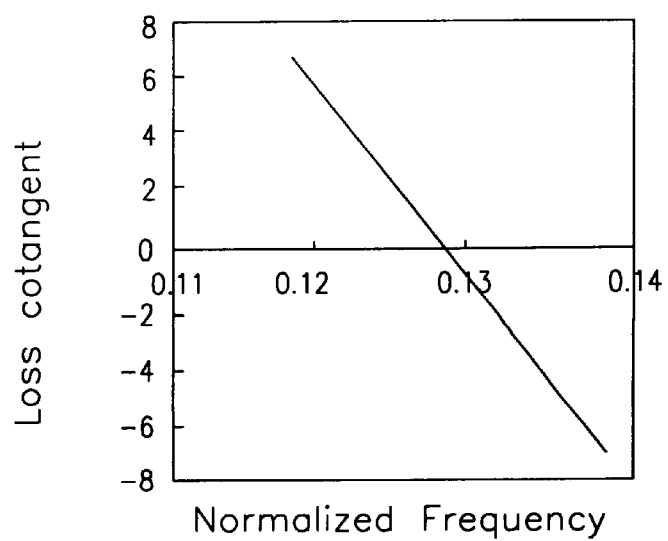
FIG. 8(b) is a view showing the relationship between the loss arc-tangent and the normalized frequency.

Next, to obtain value Q of the vibrator, loss arc-tangent is obtained by dividing the imaginary part of Equation 29 by the real part of Equation 28. FIG. 8(b) shows the relationship between loss arc-tangent and normalized frequency with the axis of ordinate as the loss arc-tangent and the axis of abscissa as the normalized frequency.

As shown in FIG. 8(b), the axis of ordinate and the axis of abscissa have a good linear relationship. From this, it is seen that the analysis model of FIG. 7 well expresses the vibrator and its characteristics.

FIGS. 8(a) and 8(b) have indicated that even if loss is expressed by difference B between the resonance frequency and the cut-off frequency on the infinite-length transmission line, the admittance characteristics of the vibrator can be satisfactorily expressed throughout a wide range of frequency including the resonance frequency.

Based on the fact that FIG. 8(b) shows the good linear relationship between the axis of ordinates and the axis of abscissas, value Q is obtained using the gradient of the resultant straight line.

Figure 9:
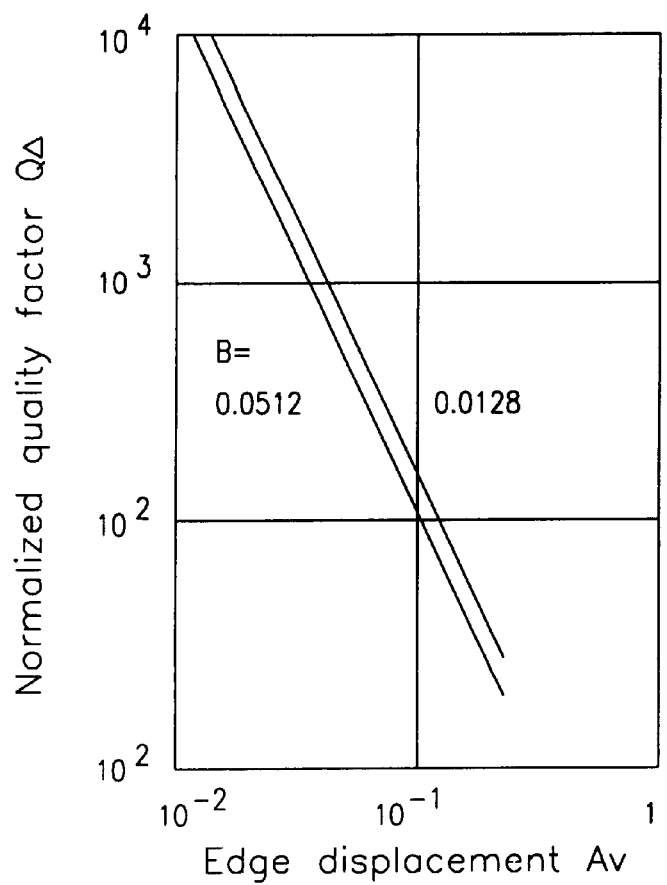
FIG. 9 shows the relationship between the quality factor Q and the displacement Av of the substrate end portion.

In FIG. 9, the axis of ordinate indicates one obtained by multiplying value Q of quality factor, obtained from the gradient of FIG. 8(b), by plate pack frequency. The axis of abscissa indicates that the relationship between the vibrator and "displacement Av of the substrate end portion" is obtained. On the axis of abscissa, relative amplitude at point A while the maximum of the vibration amplitude of the lowest-order target mode is defined 1 as "end portion displacement Av". The parameter is "difference B of normalized cut-off parameter" which is normalized difference between resonance frequency and the cut-off frequency of the infinite-length transmission line.

In FIG. 9, if "the difference B of normalized cut-off frequency" is fixed to a certain value, the axis of ordinates, i.e., "a value obtained by multiplying value Q of quality factor by plate pack frequency" is small in inverse proportion to the square of "end portion displacement Av". This can be understood from that the "end portion displacement Av" is proportional to the displacement speed at point A of the end portion.

If the "end portion displacement Av" is fixed to a certain value, it is seen that the axis of ordinates, i.e. "a value obtained by multiplying the value Q of quality factor by plate back frequency" becomes small in inverse proportion to the square root of "the difference B of normalized cut-off frequency". This is a phenomenon which can be understood from the fact that characteristic impedance of the infinite-length transmission line is proportional to the square root of the "difference B of the normalized cut-off frequency".

Figure 10:
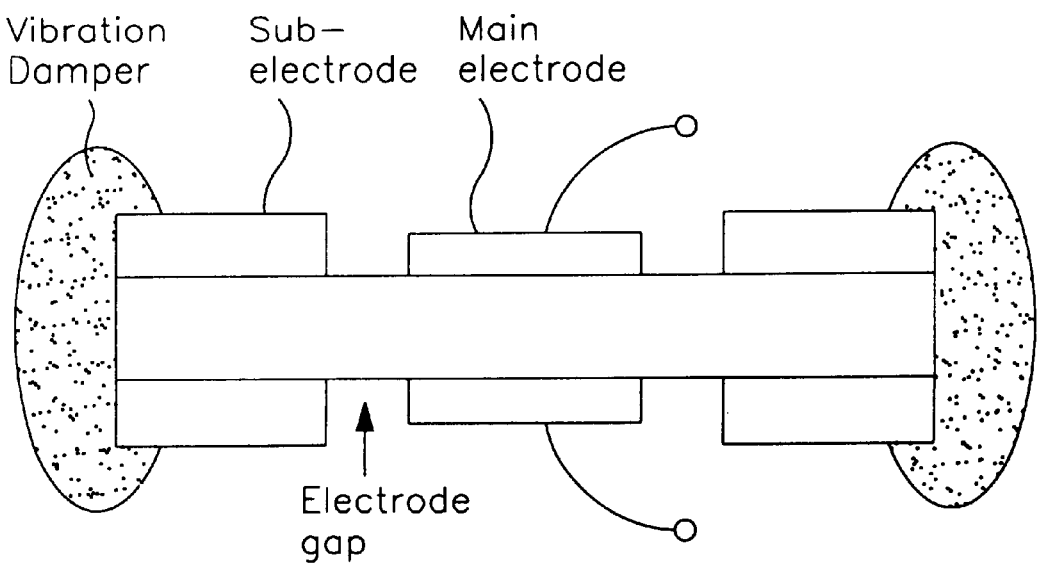
FIG. 10 shows a model of the analysis target vibrator.

FIG. 10 shows the cross-sectional view of the vibrator model that is the target of this analysis. In FIG. 10, sub electrodes of a length of c are provided via gaps b on both sides of main electrodes of a length of a. Mechanical vibration energy dampers are provided on both end portions of the sub electrodes. The object of this analysis is therefore to obtain dimensions of respective parts of the vibrator as well as the loss of the vibration energy dampers on both end portions of the vibrator.

As described above, an optimum parameter has been obtained by the lumped constant analysis.

Figure 11:
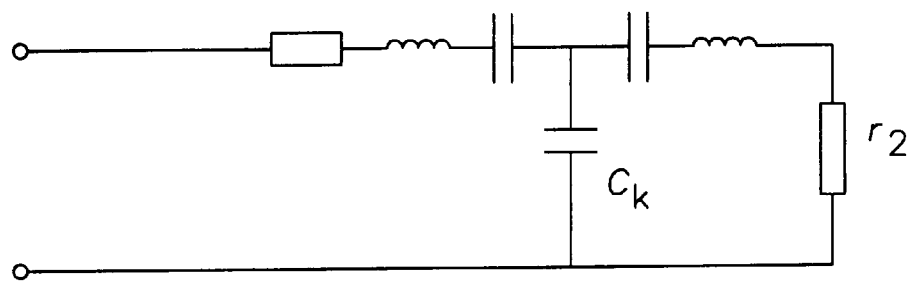
FIG. 11 shows the lumped constant equivalent circuit of FIG. 10.

A lumped constant equivalent circuit at that time is shown in FIG. 11. Therein, reference numerals 11, c2, r1 denote a main-electrode portion, ck denotes a gap without electrodes and l2, c2 and r2 denote a sub-electrode portion. It is noted that r2 is an estimated value including the resistance of the vibration energy dampers.

If two loop frequencies in FIG. 11 coincide with each other, the suppression to the vibration becomes large. In this condition, if there is the following relationship between parameters, then the admittance circle diagram has "heart shape", resulting in optimum suppression:

$$fm = \frac{1}{\sqrt{\frac{l_2}{l_1}}} \qquad (35)$$

Here, fm is obtained by the following:

$$fm = \frac{Q_2}{\gamma_2} \qquad (36)$$

Suppression degree $R_h$ at this time is expressed as:

$$R_h = 1 + \frac{Q_1}{Q_2} \qquad (37)$$

Consequently, $Q_1$ and $Q_2$ are quality factor of the two loops and obtained by the following:

$$Q_i = \frac{\omega_0 l_i}{R_i} \qquad (38)$$

Figure 12:
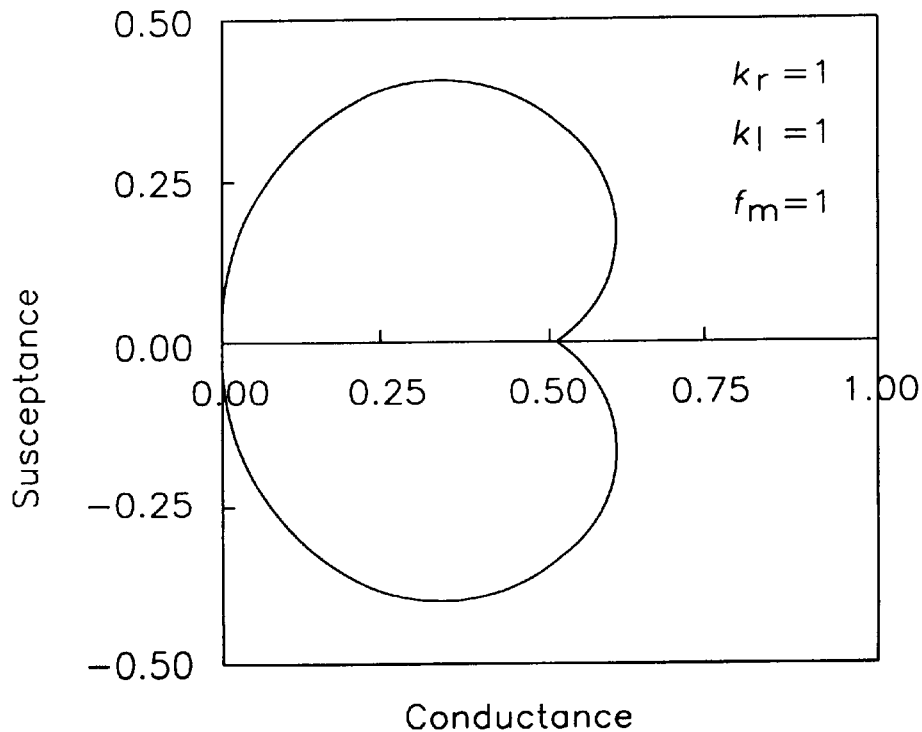
FIG. 12 shows the admittance circle diagram of FIG. 11.

FIG. 12 shows admittance obtained by numerically calculating the circle diagram based on the lumped constant analysis model shown in FIG. 11. The axis of abscissas denotes conductance G and the axis of ordinates denotes susceptance jB. Since $r_1$ is set at 1Ω in FIG. 11, the diameter of the circle diagram prior to suppression is 1. Due to the effect of the secondary side coupling on the circle diagram, the circle diagram is suppressed with the suppression degree as expressed by Equation 37. The axis of abscissa and the axis of ordinate of the diagram are multiplied by the value of Equation 37 and lengthened.

Calculation has been made on the condition that the sub-electrode is half as long as the main-electrode in consideration of a smaller-sized vibrator with 101 times suppression degree of Equation 37. Since the condition of Equation 36 is adopted, the diagram exhibits an optimum shape, that is, "heart shape".

Whether or not the "heart shape" which is the condition for setting the optimum parameter can be realized as an actual vibrator will be examined by means of distributed constant analysis.

Figure 13A:
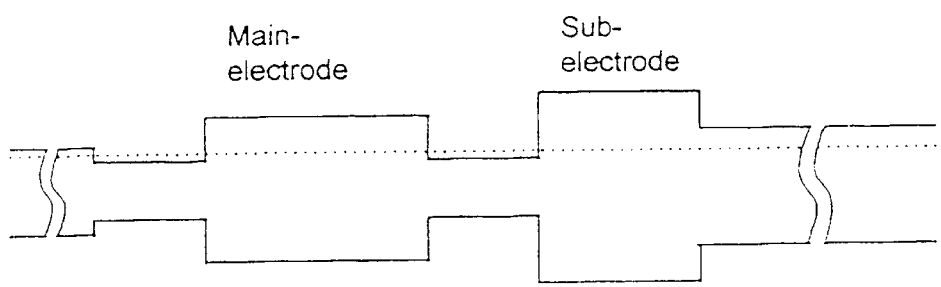
FIG. 13(a) shows a distributed constant analysis model in case a sub-electrode is provided only on one side.
Figure 13B:
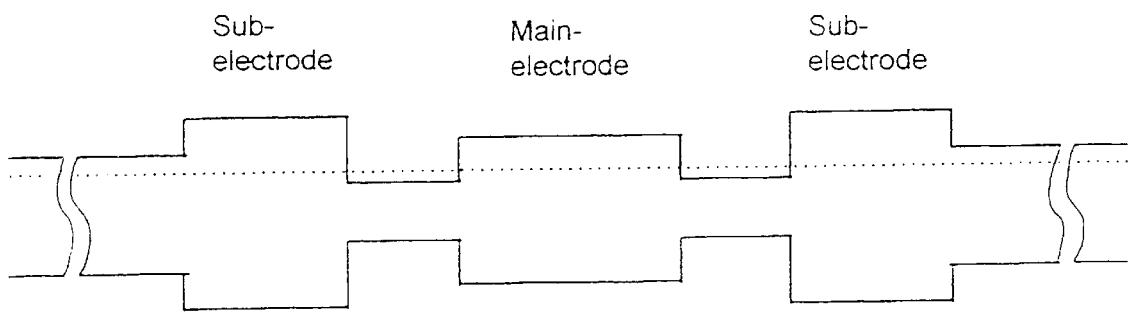
FIG. 13(b) shows a distributed constant analysis model in case sub electrodes are provided on both sides.

FIGS. 13(a) and 13(b) show a distributed constant analysis model. Specifically, FIG. 13(a) is an analysis model while assuming the same infinite-length transmission line as in FIG. 7 on the end portion on the left of main-electrode, the sub-electrode on the right thereof via a gap and an infinite-length transmission line outside of the sub-electrode. Although this model differs in structure from the actual vibrator model, such an asymmetric structure is used to express the loss of the main-electrode. FIG. 13(b) is an analysis model while assuming sub electrodes on both sides of the main-electrode via gaps and an infinite-length transmission line outside of the sub electrodes. Although no consideration is given to the vibration loss of the main-electrode in this analysis model, the structure of the vibrator coincides with the analysis model.

Analysis is first conducted to the asymmetric structure in view of the loss of the main-electrode and then to the symmetric structure.

When the input impedance ZinAA of the sub-electrode, that is, on the right side of the main-electrode in FIG. 13(a) is obtained, its real part and imaginary part are expressed as follows:

$$R_e\left(\frac{Z_{in}AA'}{Z_0}\right) = 2\frac{Z_0'}{Z_0} \frac{\frac{p}{Z_0'}(1 - \tanh^2 2\gamma_0' b)}{\left(\frac{p}{Z_0'}\tanh 2\gamma_0' b\right)^2 + \left(1 + \frac{q}{Z_0'}\tanh 2\gamma_0' b\right)^2} \qquad (39)$$

-continued $$I_m\left(\frac{Z_{in}AA'}{Z_0}\right) = \qquad (40)$$

$$-2\frac{Z_0'}{Z_0}\frac{\left\{1+\left(\frac{p}{Z_0'}\right)^2+\left(\frac{q}{Z_0'}\right)^2\right\}\tanh 2\gamma_0'b+\frac{q}{Z_0'}(1+\tanh^2 2\gamma_0'b)}{\left(\frac{p}{Z_0'}\tanh 2\gamma_0'b\right)^2+\left(1+\frac{q}{Z_0'}\tanh 2\gamma_0'b\right)^2}$$

Here, R and X are real parts and imaginary parts of the input impedance if the sub-electrode side is seen from the right of the gap, respectively, and expressed as follows:

$$\frac{p}{Z_0'} = \frac{Z_{02}}{Z_0'}\frac{\frac{Z_{03}}{Z_{02}}(1+\tan^2\gamma_{02}c)}{1+\left(\frac{Z_{03}}{Z_{02}}\tan\gamma_{02}c\right)^2} \qquad (41)$$

$$\frac{X}{Z_0'} = -\frac{Z_{02}}{Z_0'}\frac{\left\{1-\left(\frac{Z_{03}}{Z_{02}}\right)^2\right\}\tan\gamma_{02}c}{1+\left(\frac{Z_{03}}{Z_{02}}\tan\gamma_{02}c\right)^2} \qquad (42)$$

Here, $Z_{02}$ and $Z_{03}$ are equal to the characteristic impedance $g_{02}$, $g_{03}$ of the sub-electrode portion and infinite-length transmission line and the propagation constant C of the sub-electrode portion and infinite-length transmission line is the length of the sub-electrode.

Equations 32 & 33, 39 & 40 and 41 & 42 are substituted for Equations 28 and 29 to thereby obtain the mechanical part of the input impedance seen from the electric terminal. Following the optimum set value obtained by the lumped constant analysis, inductance ratio is set at 2, that is, the length of the sub-electrode is set to half of that of the main-electrode. Value Q of the main-electrode is set at 50,000 and value Q of the sub-electrode converted into suppression degree after suppression is set at 500.

Figure 14:
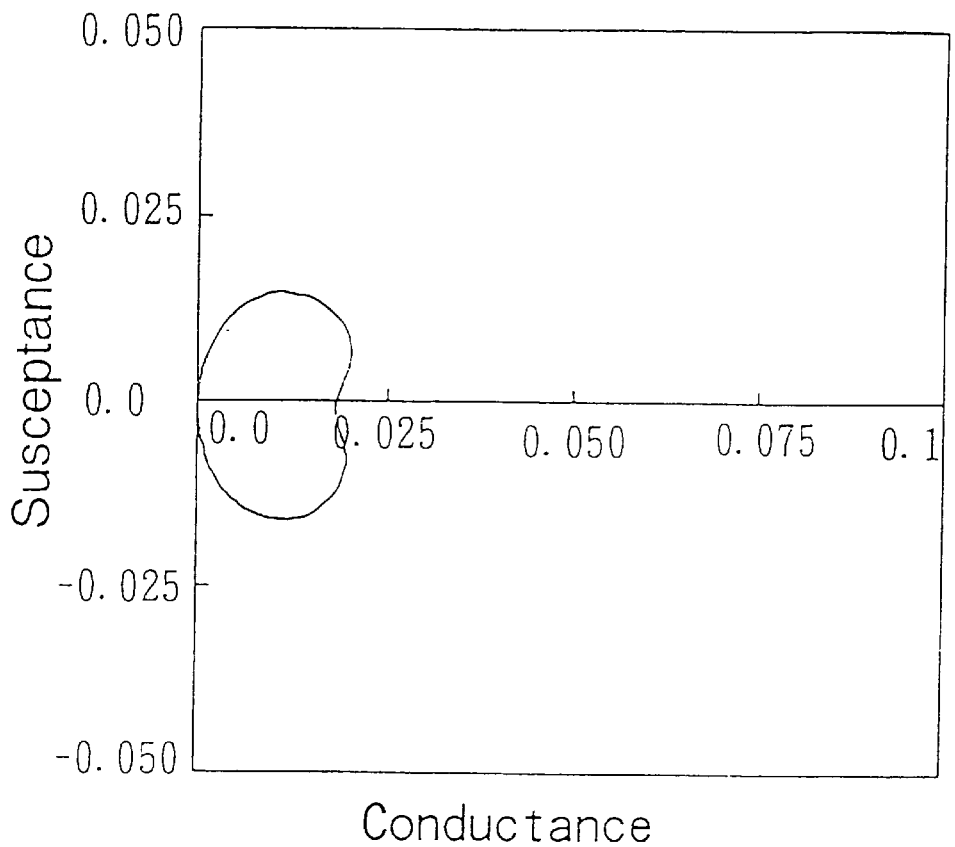
FIG. 14 shows an admittance circle diagram in case the model of FIG. 13(a) has been analyzed.

FIG. 14 shows the result of analyzing the analysis model of FIG. 13(a) in case the line is provided asymmetrically. No problem occurs to this case. As can be seen from FIG. 14, the result of the lumped constant analysis can be also obtained by this distributed constant analysis.

Figure 15:
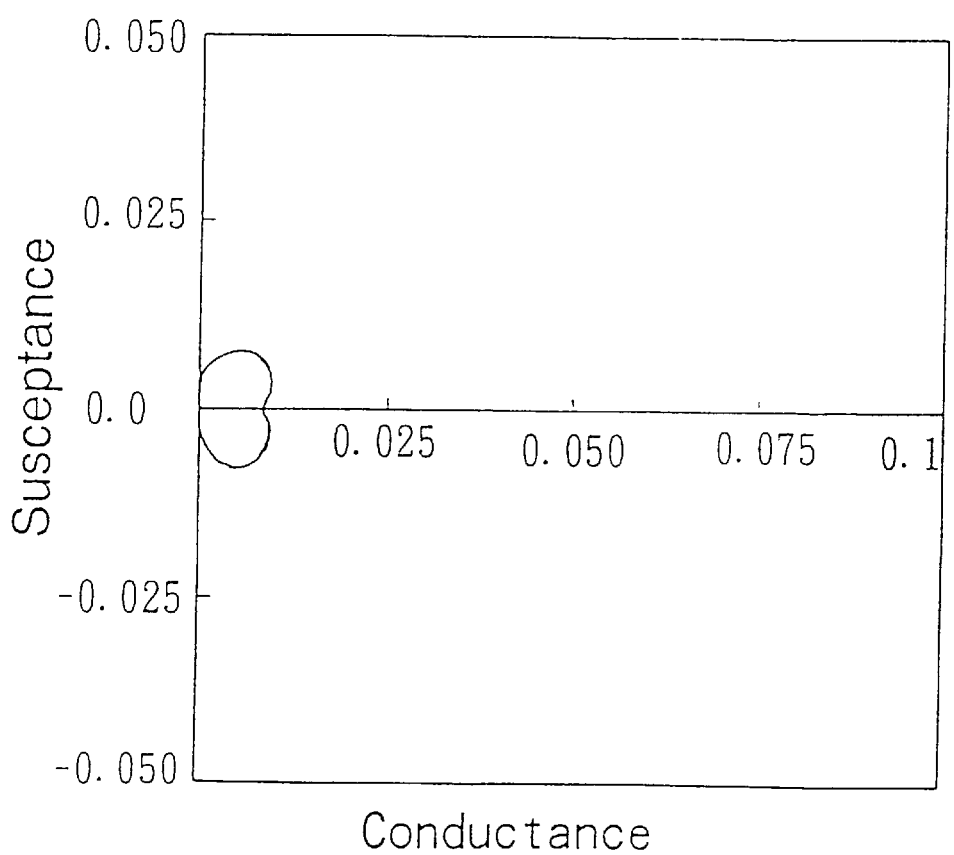
FIG. 15 shows an admittance circle diagram in case the model of FIG. 13(b) has been analyzed.

FIG. 15 is an admittance circle diagram in case of the analysis model of FIG. 13(b) with a symmetric sub-electrode. The dimensions of the sub-electrode as well as the cut-off frequency difference B of the infinite-length transmission line which results in loss, are adjusted to provide the suppression of 100 and to obtain a "heart-shaped" circle.

If the suppression degree given by Equation 37 is large, only the value Q of the sub-electrode greatly influences the diameter of the admittance circle diagram which has been suppressed. Due to this, the slight loss of the main-electrode may be negligible. This follows that it is adequate to adopt the analysis model of FIG. 13(b). In this case, a typical "heart-shaped" circle can be obtained, meaning that appropriate suppression is applied.

Figure 16A:
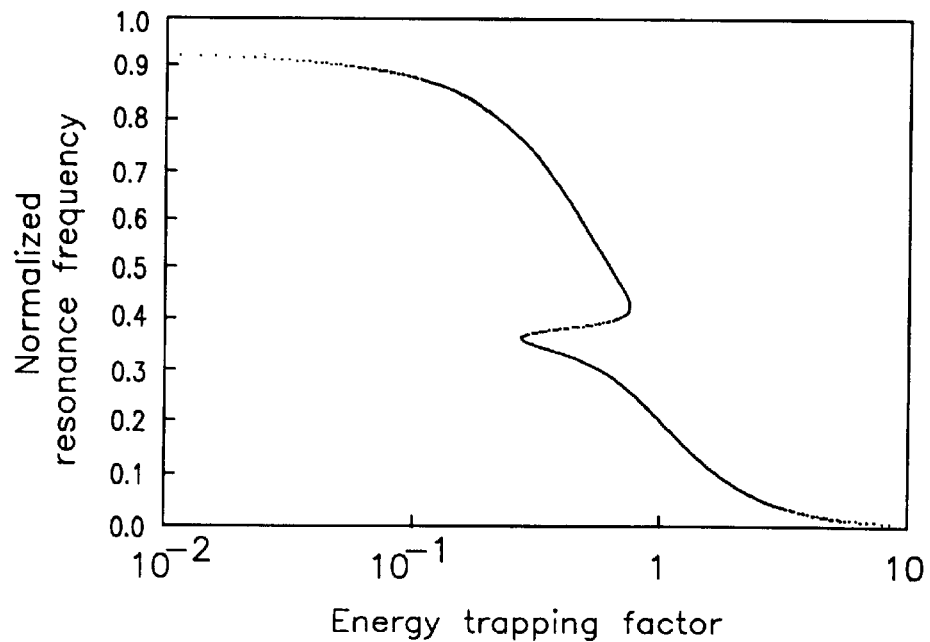
FIG. 16(a) shows a frequency spectrum of a lowest-order target mode S0.

FIG. 16(a) is a frequency spectrum of the lowest-order symmetric mode S0 which is the target of the vibrator provided with sub electrodes. The axis of abscissas indicates energy trapping factor and the axis of ordinates indicates normalized resonance frequency. Coupling occurs to the frequency spectrum at around the resonance frequency $\psi$ of 0.4. Such coupling does not occur if no sub-electrode is provided.

Figure 16B:
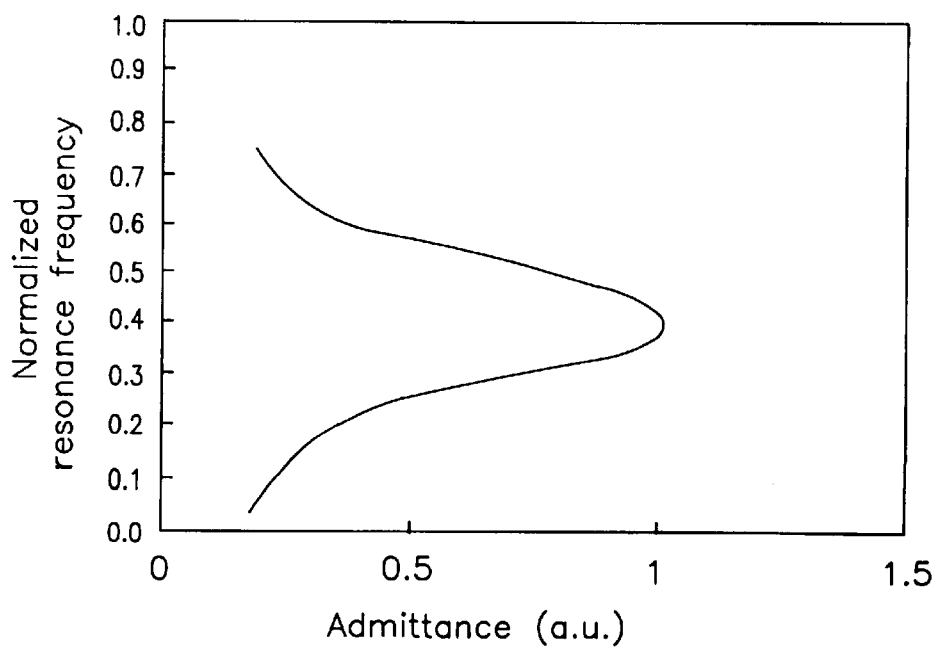
FIG. 16(b) is resonance admittance.

FIG. 16(b) shows resonance admittance in the above case. The axis of ordinates indicates normalized resonance frequency and the axis of abscissas indicates resonance admittance. The axes are expressed on an arbitrary unit. Coupling occurs to the frequency spectrum at around the resonance frequency $\psi$ of 0.4 at the axis of ordinates of FIG. 16(a). At this time, the resonance admittance of FIG. 16(b) reaches a maximum.

Figure 17:
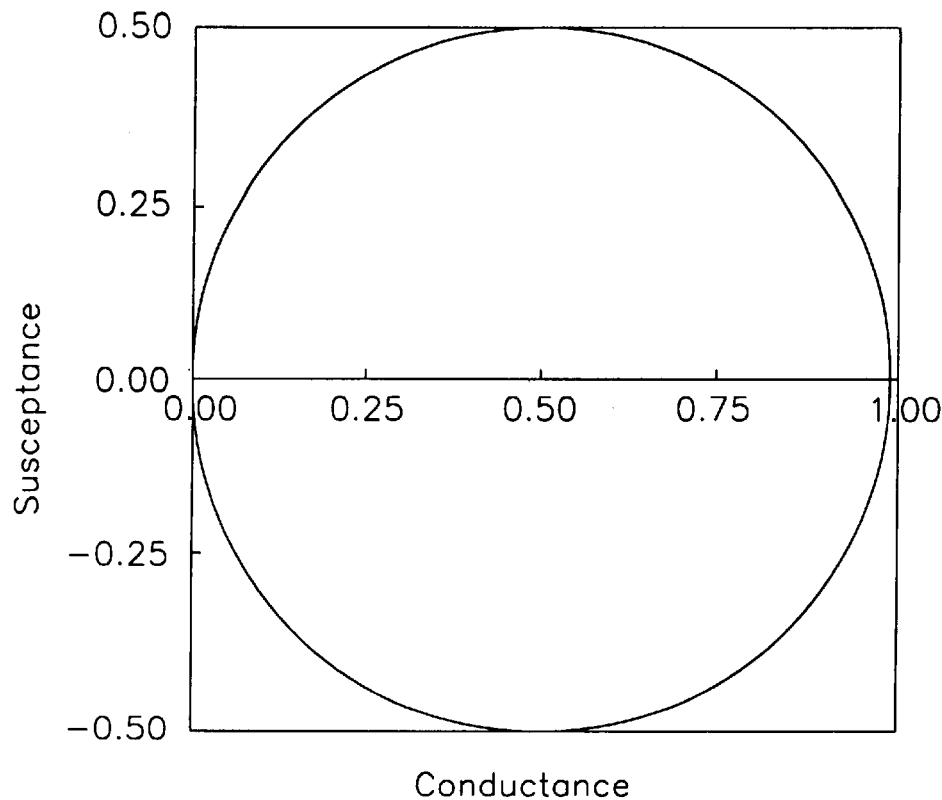
FIG. 17 shows an admittance circle diagram at the third overtone.

FIG. 15 shows an admittance circle diagram suppressed by suppression degree of 100 obtained by Equation 37. While the circle in FIG. 15 is provided on the assumption of the fundamental wave mode, FIG. 17 is an admittance circle diagram in case the vibrator is excited by third overtone mode with the dimension being set. While suppression is not applied and sub electrodes are not provided, assuming that the diameter of the admittance circle diagram in third overtone mode is the same as that of the circle diagram of FIG. 8(a), the vibrator is suppressed by about suppression degree of 100 in the fundamental wave mode and the value Q has is the same as that of the single electrode vibrator without sub electrodes in third overtone mode.

Figure 18:
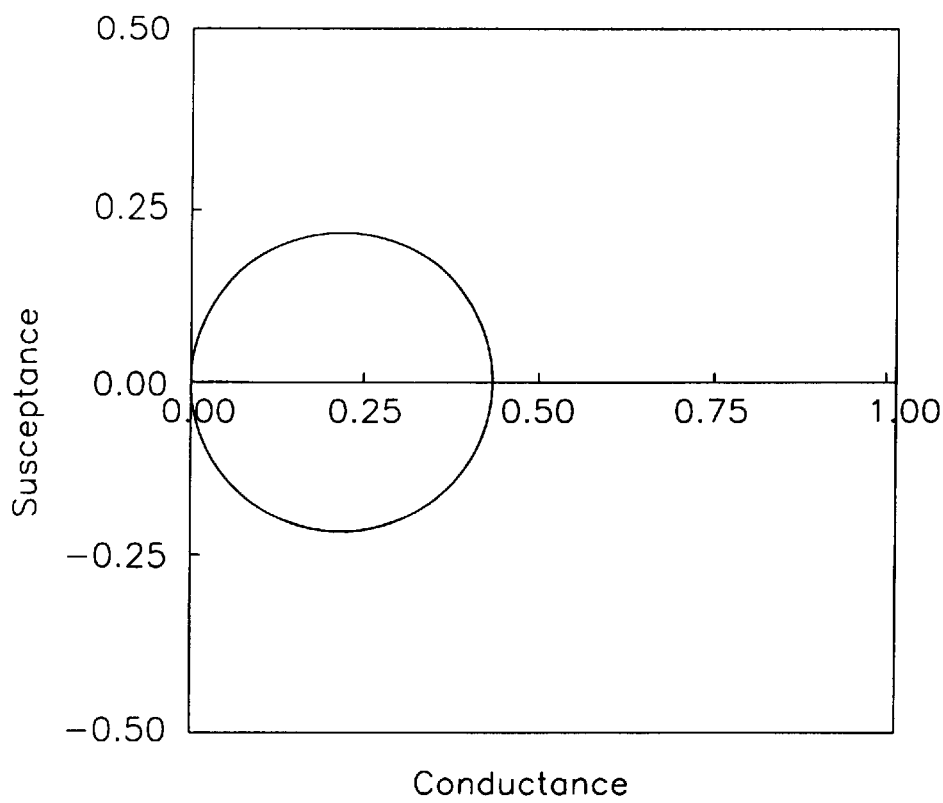
FIG. 18 shows an admittance circle diagram in case no sub-electrode is provided.

FIG. 18 is an admittance circle diagram in third overtone mode of this vibrator in case the fundamental wave mode is suppressed by the means which does not employ sub electrodes. In this case, since the diameter of the circle is about half of that of the circle of FIG. 17, even the circle of the desired mode is suppressed. This indicates that even the circle in the desired mode is suppressed if sub electrodes are not employed. It is estimated that such a vibrator results in large irregularity in resonance resistance.

The above-stated description has been given to means for suppressing a harmonic vibration of a lower order which might unnecessarily occur when overtone vibration is used, with a lumped constant circuit, while referring to a quartz resonator as an example. The above Equations should not be limited to the quartz resonator. It goes without saying that they can be also applied to other crystals such as piezoelectric crystal including $LiNbO_3$, $LiTaO_3$, LBO, $KaNbO_3$ and $La_3Ga_5SiO_{14}$.

EFFECT OF THE PRESENT INVENTION

The present invention with a structure as described above has, for the first time, clarified that large suppression can be obtained by 1) making the loop resonance frequency of the sub electrodes 3a, 3b coincident with the loop resonance frequency of the main electrodes 2a and 2b; 2) increasing the value Q ratio of the main electrodes 2a, 2b to the sub electrodes 3a, 3b; 3) optimally selecting the coupling factor between the main electrodes 2a, 2b and the sub electrodes 3a, 3b with Equations 22 and 24; 4) making it possible to realize about 100 times of suppression degree without the need to adjust the thickness of the sub electrodes 3a, 3b; and 5) making value Q of the sub electrodes 3a, 3b small. This contributes greatly to the suppression of unnecessary harmonic vibration of a lower order and provides excellent effects on the manufacture of a overtone vibrator.

We claim:

1. A harmonic vibration of a lower order suppressing piezoelectric resonator, comprising:

a pair of main electrodes, facing each other and arranged on upper and lower surfaces at an almost center of a piezoelectric substrate;

pairs of sub electrodes, facing each other and arranged on both sides of the vicinity of the main electrodes with gaps provided therebetween, respectively; and a vibration energy damper coated to deteriorate vibration strength by the sub electrodes, wherein when an electric equivalent circuit of the vibrator is expressed by a coupling circuit, which connects in series a circuit which connects in parallel a series resonance circuit ($L_2$, $C_2$, $R_2$) by the sub electrodes and the dampers to coupling capacity ($c_k$) indicating the main electrodes and the sub electrodes, to a series resonance circuit ($L_1$, $C_1$, $R_1$) by the main electrodes, loop frequency consisting of the series resonance circuit by the main electrodes and the coupling capacity substantially coincides with loop frequency consisting of the series resonance circuit by the sub electrodes and the coupling capacity.

2. A harmonic vibration of a lower order suppressing piezoelectric vibrator, wherein if value Q of a main-electrode section in a to-be-suppressed low harmonic is defined as $Q_1$, value Q of a sub-electrode section including a damper is defined as $Q_2$ and suppression degree Rh is defined as $R_h$=1+Q1/Q2 in said equivalent circuit, and coupling capacity $c_k$ is expressed as $$c_k = \frac{Q_1}{R_h - 1} \times c_2 \sqrt{\frac{l_2}{l_1}}$$

then a gap between a main-electrode and a sub-electrode is determined from dimensions of said main-electrode and said sub-electrode, frequency decrease of said main-electrode and frequency decrease of said sub-electrode, based on the coupling capacity $c_k$.

3. A harmonic vibration of a lower order suppressing piezoelectric vibrator according to claim 1 or 2, wherein a difference between the loop frequency of said main-electrode section and the loop frequency of said sub-electrode section falls within a range of ±4×10$^{-4}$.

4. A harmonic vibration of a lower order suppressing piezoelectric vibrator according to claim 1 or 2, wherein equivalent resistance of harmonic vibration of a lower order is suppressed by setting said suppression degree $R_h$ at a cube of order n of desired harmonic or more to selectively oscillate the desired harmonic.

5. A harmonic vibration of a lower order suppressing piezoelectric vibrator according to claim 3, wherein equivalent resistance of harmonic vibration of a lower order is suppressed by setting said suppression degree $R_h$ at a cube of order n of desired harmonic or more to selectively oscillate the desired harmonic.

* * * * *

UNITED STATES PATENT AND TRADEMARK OFFICE
CERTIFICATE OF CORRECTION

PATENT NO. : 6,057,629
DATED : May 2, 2000
INVENTOR(S) : Kiyoshi Nakamura et al

It is certified that error appears in the above-indentified patent and that said Letters Patent is hereby corrected as shown below:

Item [73] Assignees: Change "Kiyoshi Nakamura, Miyagi; Toyo Communications Equipment Co., Ltd., Kanagawa, both of Japan," to --Kiyoshi Nakamura, Miyagi; Toyo Communication Equipment Co., Ltd., Kanagawa, both of Japan--

Signed and Sealed this

Fifteenth Day of May, 2001

Attest:

NICHOLAS P. GODICI

Attesting Officer        Acting Director of the United States Patent and Trademark Office